United States Patent
Kim et al.

(10) Patent No.: US 8,841,690 B1
(45) Date of Patent: Sep. 23, 2014

(54) OPTICAL SEMICONDUCTOR LIGHTING APPARATUS

(71) Applicant: Posco LED Company Ltd., Seongnam-si (KR)

(72) Inventors: Ji Wan Kim, Seongnam-si (KR); Yun Ha Kim, Seongnam-si (KR); Jung Hwa Kim, Seongnam-si (KR)

(73) Assignee: Posco LED Company Ltd., Seongnam-si (KR)

( * ) Notice: Subject to any disclaimer, the term of this patent is extended or adjusted under 35 U.S.C. 154(b) by 0 days.

(21) Appl. No.: 13/920,350

(22) Filed: Jun. 18, 2013

(30) Foreign Application Priority Data

May 2, 2013 (KR) .......... 10-2013-0049419

(51) Int. Cl.
| | |
|---|---|
| *H01L 29/22* | (2006.01) |
| *H01L 29/227* | (2006.01) |
| *H01L 33/00* | (2010.01) |
| *H01L 29/24* | (2006.01) |
| *H01L 33/52* | (2010.01) |
| *H01L 33/58* | (2010.01) |

(52) U.S. Cl.
CPC ............. *H01L 33/52* (2013.01); *H01L 33/58* (2013.01)
USPC ........ 257/98; 257/99; 257/100; 257/E33.056; 257/E33.058; 257/E33.059

(58) Field of Classification Search
USPC ............. 257/98, 99, 100, E33.056, E33.058, 257/E33.059
See application file for complete search history.

(56) References Cited

U.S. PATENT DOCUMENTS

| | | | | |
|---|---|---|---|---|
| 7,312,477 | B2* | 12/2007 | Yatsuda et al. ................. | 257/98 |
| 8,058,667 | B2* | 11/2011 | Tran et al. ....................... | 257/99 |
| 8,684,580 | B2* | 4/2014 | Min .............................. | 362/609 |
| 2010/0072499 | A1* | 3/2010 | Kwon et al. .................... | 257/98 |
| 2010/0155771 | A1* | 6/2010 | Bando ............................ | 257/99 |
| 2011/0220926 | A1* | 9/2011 | Kim ............................... | 257/91 |
| 2012/0292658 | A1* | 11/2012 | Chen et al. ..................... | 257/99 |
| 2013/0026529 | A1* | 1/2013 | Tsang ............................ | 257/99 |

FOREIGN PATENT DOCUMENTS

| | | |
|---|---|---|
| KR | 100595408 | 6/2006 |
| KR | 1020100076625 | 6/2010 |

* cited by examiner

*Primary Examiner* — Ida M Soward
(74) *Attorney, Agent, or Firm* — H.C. Park & Associates, PLC

(57) ABSTRACT

An optical semiconductor lighting apparatus includes a light emitting module including a semiconductor optical device, a housing to house the light emitting module, a first sealing body connected to a groove recessed in a polygonal or closed-curve shape of the housing, a first optical cover covering an outer edge of the groove and a top surface of the housing, a first rib formed on a top surface of the first sealing body along a forming direction of the first sealing body, and a pair of second ribs formed in parallel along both edges of a bottom surface of the first sealing body.

12 Claims, 1 Drawing Sheet

OPTICAL SEMICONDUCTOR LIGHTING APPARATUS

CROSS-REFERENCE(S) TO RELATED APPLICATION

This application claims priority from and the benefit of Korean Patent Application No. 10-2013-0049419, filed on May 2, 2013, which is incorporated herein by reference for all purposes as if fully set forth herein.

BACKGROUND

1. Field

The present invention relates to an optical semiconductor lighting apparatus, and more particularly, to an optical semiconductor lighting apparatus that can prevent penetration of moisture, particles, dust or the like and can improve the durability and connectivity thereof in its entirety.

2. Discussion of the Background

As compared with incandescent bulbs and fluorescent lamps, optical semiconductors using a light source, such as a light emitting diode (LED), an organic LED, a laser diode, and an organic electroluminescent diode, have low power consumption, long lifespan, superior durability, and high luminance. Due to these advantages, the optical semiconductors have recently attracted attention as an illumination component.

Generally, a lighting apparatus using the optical semiconductor as a light source includes a housing accommodating a light emitting module in which a plurality of optical semiconductors are arrayed, and an optical cover facing the optical semiconductors and finishing one opened surface of the housing.

In order to prevent foreign substances such as moisture or dust from flowing into a light emitting module side, the optical cover is fixed to the housing by press-fitting a sealing member, such as an O-ring, of which the cross-section is a " ⊏ " or "C" shape along edges thereof.

However, such a sealing member contracts or expands according to external environment change such as temperature or pressure, causing a problem in sealing maintenance.

Therefore, there is an urgent need for apparatuses that can solve the above problems, prevent penetration of moisture and foreign substances, and improve the durability thereof in their entirety.

SUMMARY

The present invention has been made in an effort to solve the above problems, and provides an optical semiconductor lighting apparatus that can prevent penetration of moisture and foreign substances and improve the durability thereof in its entirety.

According to an embodiment of the present invention, an optical semiconductor lighting apparatus includes: a light emitting module including a semiconductor optical device; a housing including the light emitting module; a first sealing body connected to a groove recessed in a polygonal or closed-curve shape of the housing; a first optical cover covering an outer edge of the groove and a top surface of the housing; a first rib formed on a top surface of the first sealing body along a forming direction of the first sealing body; and a pair of second ribs formed in parallel along both edges of a bottom surface of the first sealing body.

The first rib may come into contact with the first optical cover and allow elastic deformation.

The pair of second ribs may come into contact with a bottom surface of the groove and allows elastic deformation.

The first sealing body may allow elastic deformation between the first and second ribs according to a load and pressure of the first optical cover.

The housing may further include a first stepped portion formed with a height difference along the outer edge of the groove, and an edge of the first optical cover may come into contact with the first stepped portion.

The housing may further include a first stepped portion formed with a height difference along the outer edge of the groove, and a thickness of the first optical cover may be equal to a height of the first stepped portion protruding from the outer edge of the groove.

The housing may further include: a first stepped portion formed with a height difference along the outer edge of the groove; a second stepped portion formed with a height difference on a top surface of the first stepped portion; and a cover press ring pressing an edge of the first optical cover, which comes into contact with the first stepped portion, and the top surface of the first stepped portion.

An edge of the cover press ring may come into contact with the second stepped portion. A thickness of the first optical cover may be equal to a height of the first stepped portion protruding from the outer edge of the groove. A thickness of the cover press ring may be equal to a height of the second stepped portion protruding from the first stepped portion.

The housing may further include: a first stepped portion formed with a height difference along the outer edge of the groove; a second stepped portion formed with a height difference on a top surface of the first stepped portion; an outer cover covering a top surface of the second stepped portion and one side of the housing; and a second sealing body disposed on a top surface of the second stepped portion and covered by the outer cover, an edge of the first optical cover comes into contact with the first stepped portion, and a thickness of the first optical cover is equal to a height of the first stepped portion protruding from the outer edge of the groove.

The housing may further include a cover press ring pressing an edge of the first optical cover, which comes into contact with the first stepped portion, and a top surface of the first stepped portion. A thickness of the cover press ring may be equal to a height of the second stepped portion protruding from the first stepped portion. An edge of the cover press ring may come into contact with the second stepped portion. The second sealing body may press a top surface of the second stepped portion and an upper portion of the cover press ring.

The housing may further include: a first stepped portion formed with a height difference along the outer edge of the groove; a second stepped portion formed with a height difference on a top surface of the first stepped portion; an outer cover covering a top surface of the second stepped portion and a side of the housing; and a positioning rib formed on the outer cover along a forming direction of the outer cover.

The housing may further include a second optical cover fixed inside the positioning rib.

In addition, the term "semiconductor optical device" as used in claims and detailed description refers to an LED chip or the like that includes or uses optical semiconductor.

The "semiconductor optical device" may include a package-level device with various types of optical semiconductor as well as the above-mentioned LED chip.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
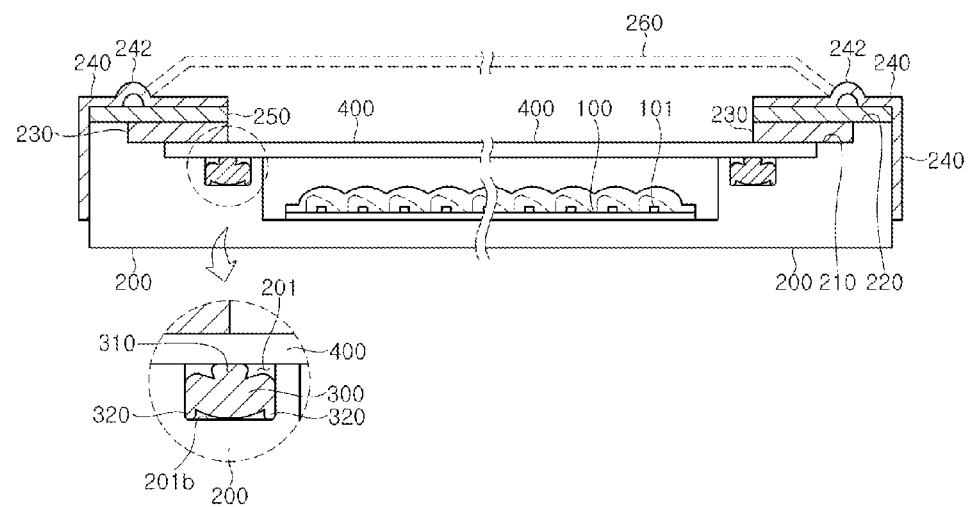
FIG. 1 is a cross-sectional conceptual diagram illustrating an overall configuration of an optical semiconductor lighting apparatus according to an embodiment of the present invention.

Exemplary embodiments of the present invention will be described below in detail with reference to the accompanying drawings. Throughout the disclosure, like reference numerals refer to like parts throughout the drawings and embodiments of the present invention.

Hereinafter, exemplary embodiments of the present invention will be described with reference to the accompanying drawings.

Figure 2:
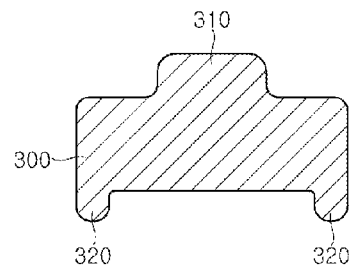
FIG. 2 is a cross-sectional conceptual diagram illustrating pre-modification states of a first sealing body and first and second ribs, which are essential components of the optical semiconductor lighting apparatus according to the embodiment of the present invention.

FIG. 1 is a cross-sectional conceptual diagram illustrating an overall configuration of an optical semiconductor lighting apparatus according to an embodiment of the present invention, and FIG. 2 is a cross-sectional conceptual diagram illustrating pre-modification states of a first sealing body and first and second ribs, which are essential components of the optical semiconductor lighting apparatus according to the embodiment of the present invention.

As illustrated in FIGS. 1 and 2, the optical semiconductor lighting apparatus includes a light emitting module 100, a housing 200, a first sealing body 300, a first optical cover 400, a first rib 310, and a second rib 320.

The light emitting module 100 includes one or more semiconductor optical devices 101 operating as a light source, a circuit board, and a driving circuit (not illustrated) for driving the semiconductor optical devices 101.

The housing 200 accommodates the light emitting module 100, and provides a space for mounting the first sealing body 300 and the first optical cover 400 to be described below.

The first sealing body 300 is coupled to a groove 201 recessed in the housing 200 along edges of the light emitting module 100 in a polygonal or closed-curve shape. The first sealing body 300 is provided for maintaining sealing while preventing moisture and foreign substances from flowing into the light emitting module 100 through the inside of the housing 200.

The first optical cover 400 covers the outer edge of the groove 201 and the top surface of the housing 200. The first optical cover 400 prevents inflow of moisture and foreign substances and protects the light emitting module 100 such as the semiconductor optical devices 101 from the exterior by covering the opened top surface of the housing 200. In addition, the first optical cover 400 performs an optical function of diffusing or reducing light emitted from the semiconductor optical devices 101.

The first rib 310 is formed on the top surface of the first sealing body 300 along a forming direction of the first sealing body 300. The first rib 310 is integrally formed with the first sealing body 300 and is formed using the same material as the first sealing body 300. The first rib 310 primarily disperses and supports a force and pressure applied from the edge of the first optical cover 400 while coming into contact with the first optical cover 400.

The second rib 320 is provided with a pair of ribs formed in parallel along both edges of the bottom surface of the first sealing body 300. The second rib 320 is integrally formed with the first sealing body 300 and is formed using the same material as the first sealing body 300. The second rib 320 secondarily disperses and supports a force and pressure applied from the edge of the first optical cover 400 while coming into contact with the groove 201.

In addition to the above-described embodiment, the following various embodiments can also be applied to the present invention.

The first and second ribs 310 and 320 are formed from the first sealing body 300 as described above, and maintain sealing while appropriately dispersing and supporting a force and pressure applied along a vertical direction of the first sealing body 300.

That is, the first rib 310 comes into contact with the first optical cover 400 and allows elastic deformation in a state of FIG. 2, as shown in the enlarged portion of FIG. 1. The pair of second ribs 320 comes into contact with the bottom surface 201b of the groove 201 and allows elastic deformation in a state of FIG. 2, as shown in the enlarged portion of FIG. 1.

In this case, the first sealing body 300 allows elastic deformation in a state of FIG. 2, as shown in the enlarged portion of FIG. 1, according to a load and pressure of the first optical cover 400 between the first and second ribs 310 and 320.

On the other hand, the housing 200 further includes a first stepped portion 210 formed with a height difference along the outer edge of the groove 201 in order for connection of the first optical cover 400 and sealing maintenance. The edge of the first optical cover 400 may come into contact with the first stepped portion 210.

A thickness of the first optical cover 400 may be equal to a height of the first stepped portion 210 protruding from the outer edge of the groove 201.

In this case, the housing 200 may further include a second stepped portion 220 and a cover press ring 230. The second stepped portion 220 is formed on the first stepped portion with a height difference with respect to the first stepped portion 210. The cover press ring 230 presses the edge of the first optical cover 400 coming into contact with the first stepped portion 210, and the top surface of the first stepped portion 210.

The edge of the cover press ring 230 comes into contact with the second stepped portion 220, and the cover press ring 230 presses the first optical cover 400 while coming into close contact with the first optical cover 400, thereby avoiding the inconvenience of coupling with bolts along the edge of the first optical cover 400.

The cover press ring 230 presses the edge of the first optical cover 400, which comes into contact with the first stepped portion 210, and the top surface of the first stepped portion 210. A thickness of the cover press ring 230 is equal to a height of the second stepped portion 220 protruding from the first stepped portion, and the edge of the cover press ring 230 comes into contact with the second stepped portion 220.

On the other hand, the housing 200 may include an outer cover 240 covering the top surface of the second stepped portion 220 and the side of the housing 200, and a second sealing body 250 disposed on the top surface of the stepped portion 220 and covered by the outer cover 240.

When a general-purpose lighting apparatus as well as a lighting apparatus such as canopy light is mounted in the housing 200, in particular, when a ceiling-recessed lighting apparatus is used, the outer cover 240 prevents moisture from flowing from the ceiling to the light emitting module 100.

In the outer cover 240, a positioning rib 242 may be further formed on the outer cover 240 along a forming direction of the outer cover 240. Therefore, a second optical cover 260 may be additionally mounted inside the positioning rib 242.

That is, the positioning rib 242 allows a user to perform operations while checking and determining an accurate installation position of the optical component, such as the second optical cover 260, with his/her naked eye.

When a fixing material, such as silicon, is coated along the edge of the second optical cover 260 so as to fix the second optical cover 260, the positioning rib 242 prevents the fixing material from flowing into the light emitting module 100 and allows the installation of additional optical components.

The second sealing body 250 secondarily blocks moisture and foreign substances introduced through the outer cover 240, and protects the entire apparatus by absorbing or dispersing external shocks applied to the first optical cover 400.

For this purpose, the second sealing body 250 is configured to press the top surface of the second stepped portion 220 and the upper portion of the cover press ring 230.

As described above, the basic technical spirit of the present invention is to provide the optical semiconductor lighting apparatus according to the present invention can prevent penetration of moisture and foreign substances, and improve the durability of the entire apparatus.

The above-described configurations according to the present invention can obtain the following effects.

First, since the first sealing body primarily maintains sealing, it is possible to fundamentally prevent inflow of moisture or foreign substances. In addition, while allowing elastic deformation, the first and second ribs formed on the top and bottom surfaces of the first sealing body effectively distribute and support the pressure and force applied to the edges and entire surfaces of the first optical cover to be connected to the housing. Therefore, the durability of the entire apparatus can be improved.

In particular, since the optical semiconductor lighting apparatus of the present invention can be used for a long time without degradation in sealing performance, products with high reliability can be supplied to consumers.

While the embodiments of the present invention have been described with reference to the specific embodiments, it will be apparent to those skilled in the art that various changes and modifications may be made without departing from the spirit and scope of the invention as defined in the following claims.

What is claimed is:

1. An optical semiconductor lighting apparatus, comprising:
   a light emitting module including a semiconductor optical device;
   a housing in which the light emitting module is disposed;
   a first sealing body connected to a groove recessed in a polygonal or closed-curve shape of the housing;
   a first optical cover covering an outer edge of the groove and a top surface of the housing;
   a first rib formed on a top surface of the first sealing body along a forming direction of the first sealing body; and
   a pair of second ribs formed in parallel along both edges of a bottom surface of the first sealing body.

2. The optical semiconductor lighting apparatus of claim 1, wherein the first rib comes into contact with the first optical cover and allows elastic deformation.

3. The optical semiconductor lighting apparatus of claim 1, wherein the pair of second ribs comes into contact with a bottom surface of the groove and allows elastic deformation.

4. The optical semiconductor lighting apparatus of claim 1, wherein the first sealing body exhibits elastic deformation between the first and second ribs, according to a load and pressure of the first optical cover.

5. The optical semiconductor lighting apparatus of claim 1, wherein,
   the housing comprises a first stepped portion formed with a height difference along the outer edge of the groove, and
   an edge of the first optical cover contacts the first stepped portion.

6. The optical semiconductor lighting apparatus of claim 1, wherein,
   the housing comprises a first stepped portion formed with a height difference along the outer edge of the groove, and
   a thickness of the first optical cover is equal to a height of the first stepped portion protruding from the outer edge of the groove.

7. The optical semiconductor lighting apparatus of claim 1, wherein the housing comprises:
   a first stepped portion formed with a height difference along the outer edge of the groove;
   a second stepped portion formed with a height difference on a top surface of the first stepped portion; and
   a cover press ring pressing an edge of the first optical cover, which comes into contact with the first stepped portion, and the top surface of the first stepped portion.

8. The optical semiconductor lighting apparatus of claim 7, wherein,
   an edge of the cover press ring comes into contact with the second stepped portion,
   a thickness of the first optical cover is equal to a height of the first stepped portion protruding from the outer edge of the groove, and
   a thickness of the cover press ring is equal to a height of the second stepped portion protruding from the first stepped portion.

9. The optical semiconductor lighting apparatus of claim 1, wherein the housing comprises:
   a first stepped portion formed with a height difference along the outer edge of the groove;
   a second stepped portion formed with a height difference on a top surface of the first stepped portion;
   an outer cover covering a top surface of the second stepped portion and one side of the housing; and
   a second sealing body disposed on a top surface of the second stepped portion and covered by the outer cover, wherein,
   an edge of the first optical cover comes into contact with the first stepped portion, and
   a thickness of the first optical cover is equal to a height of the first stepped portion protruding from the outer edge of the groove.

10. The optical semiconductor lighting apparatus of claim 9, wherein,
   the housing further comprises a cover press ring pressing an edge of the first optical cover, which contacts the first stepped portion and a top surface of the first stepped portion,
   a thickness of the cover press ring is equal to a height of the second stepped portion protruding from the first stepped portion,
   an edge of the cover press ring comes into contact with the second stepped portion, and
   the second sealing body presses a top surface of the second stepped portion and an upper portion of the cover press ring.

11. The optical semiconductor lighting apparatus of claim 1, wherein the housing comprises:
- a first stepped portion formed with a height difference along the outer edge of the groove;
- a second stepped portion formed with a height difference on a top surface of the first stepped portion;
- an outer cover covering a top surface of the second stepped portion and a side of the housing; and
- a positioning rib formed on the outer cover along a forming direction of the outer cover.

12. The optical semiconductor lighting apparatus of claim 11, wherein the housing further comprises a second optical cover fixed inside the positioning rib.

* * * * *